United States Patent [19]

Lehmann

[11] 4,173,742
[45] Nov. 6, 1979

[54] ANTENNA ISOLATION DEVICE

[75] Inventor: William L. Lehmann, Indianapolis, Ind.

[73] Assignee: RCA Corporation, New York, N.Y.

[21] Appl. No.: 878,131

[22] Filed: Feb. 15, 1978

[51] Int. Cl.² .............................................. H01P 5/12
[52] U.S. Cl. ...................................... 333/100; 333/12; 325/362
[58] Field of Search ............... 333/6, 11, 12; 325/357, 325/362, 381, 385; 343/850, 865; 336/175, 180

[56] References Cited

U.S. PATENT DOCUMENTS

| | | | |
|---|---|---|---|
| 2,757,343 | 7/1956 | Eland | 333/26 |
| 2,865,006 | 12/1958 | Sabaroff | 333/33 |
| 3,449,704 | 6/1969 | Matsushima et al. | 336/175 |
| 3,938,046 | 2/1976 | Valdettaro | 325/362 |

OTHER PUBLICATIONS

Sevick, *Broadband Matching Transformers Can Handle Many Kilowatts*, Electronics, Nov. 25, 1976, p. 123.
Ruthroff, *Some Broadband Transformers*, Proceedings of the IRE, vol. 47, Aug. 1959, p. 1337.

*Primary Examiner*—Eugene R. LaRoche
*Assistant Examiner*—Robert E. Wise
*Attorney, Agent, or Firm*—Eugene M. Whitacre; Paul J. Rasmussen; Peter M. Emanuel

[57] ABSTRACT

An isolation device coupled between an antenna network and a fixed tuned VHF/UHF signal splitter includes a first bifilar transmission line and a second bifilar transmission line wound with multiple turns about separate toroidal portions of a magnetic core. Each of the bifilar transmission lines has first and second conductors. At an input port of the device, the first conductor of the first transmission line and the second conductor of the second transmission line are coupled to respective antenna terminals of the antenna network and the second conductor of the first transmission line and the first conductor of the second transmission line are coupled together. At an output port of the device, the second conductor of the first transmission line and the first conductor of the second transmission line are coupled to respective input terminals of the signal splitter and the first conductor of the first transmission line and the second conductor of the second transmission line are coupled together. The number of turns of each of the transmission lines about its respective toroidal portion is selected to provide sufficient amplitude response in the UHF range. The permeability of the core is selected to provide sufficient amplitude response in the VHF range.

9 Claims, 3 Drawing Figures

ANTENNA ISOLATION DEVICE

BACKGROUND OF THE INVENTION

The present invention relates to the field of antenna coupling circuits.

Manufacturers of television receivers and the like are becoming increasingly concerned with safety. One area of considerable importance concerns apparatus for isolating the antenna of a receiver from the receiver itself so that excessively high energy discharges due to chassis potential and lightning are inhibited from being coupled to the receiver from the antenna.

While transformers are known (see, for example, U.S. Pat. No. 3,449,704) which may be used to DC isolate a receiver from an antenna network, these transformers have limited amplitude versus frequency response characteristics and are therefore inadequate for coupling RF signals in both the VHF and UHF ranges from the antenna to RF signal processing circuits of the receiver. As a result, separate transformer devices for each of the VHF and UHF ranges may be required.

Also known is an antenna coupling network utilizing transmission lines (see U.S. Pat. No. 2,757,343) which are constructed without a direct connection between input and output to purposely provide inefficient coupling between an antenna network and an RF circuit. In such an arrangement, the RF circuit must be tuned at each channel in order to provide adequate RF signal coupling. Therefore, such arrangements cannot readily be used between an antenna network and a VHF/UHF signal splitter which is fixed tuned.

Other techniques for coupling antennas utilizing both transmission line and transformer techniques to produce broadband transmission line transformers are know (see, for example, an article entitled, "Some Broad-Band Transformers", by C. L. Ruthroff, appearing in *Proceedings of the IRE*, Volume 47, August, 1959, pages 1337-1342 and U.S. Pat. No. 2,865,006). Unfortunately, these arrangements all include a direct connection between input and output terminals and are therefore not useful as antenna isolation devices.

SUMMARY OF THE PRESENT INVENTION

A device for coupling RF signals in a television frequency range from an antenna network to an RF signal processing circuit includes a first and second transmission lines each having first and second conductors. The first and second transmission lines are wound in the same sense about a closed loop configuration core with a predetermined number of turns. The core is formed of a magnetic material having a permeability inversely related to frequency and specifically selected to provide a suitable amplitude versus frequency response throughout the lower portion of the range. The predetermined number of turns is selected to provide a suitable amplitude versus frequency response throughout the upper portion of the range. At an input port of the device, a first end of the first conductor of the first transmission line and a first end of the second conductor of the second transmission line define input leads to which the antenna network may be coupled and a first end of the second conductor of the first transmission line and a first end of the first conductor of the second transmission line are coupled together. At an output port of the device, the second end of the second conductor of the first transmission line and the second end of the first conductor of the second transmission line define output leads to which the RF signal processing circuit may be coupled and the second end of the first conductor of the first transmission line and the second end of the second conductor of the second transmission line are coupled together.

BRIEF DESCRIPTION OF THE DRAWING

FIG. 3 shows some response characteristics useful in understanding the operation of the device of FIG. 1.

DETAILED DESCRIPTION OF THE DRAWING

Figure 1:
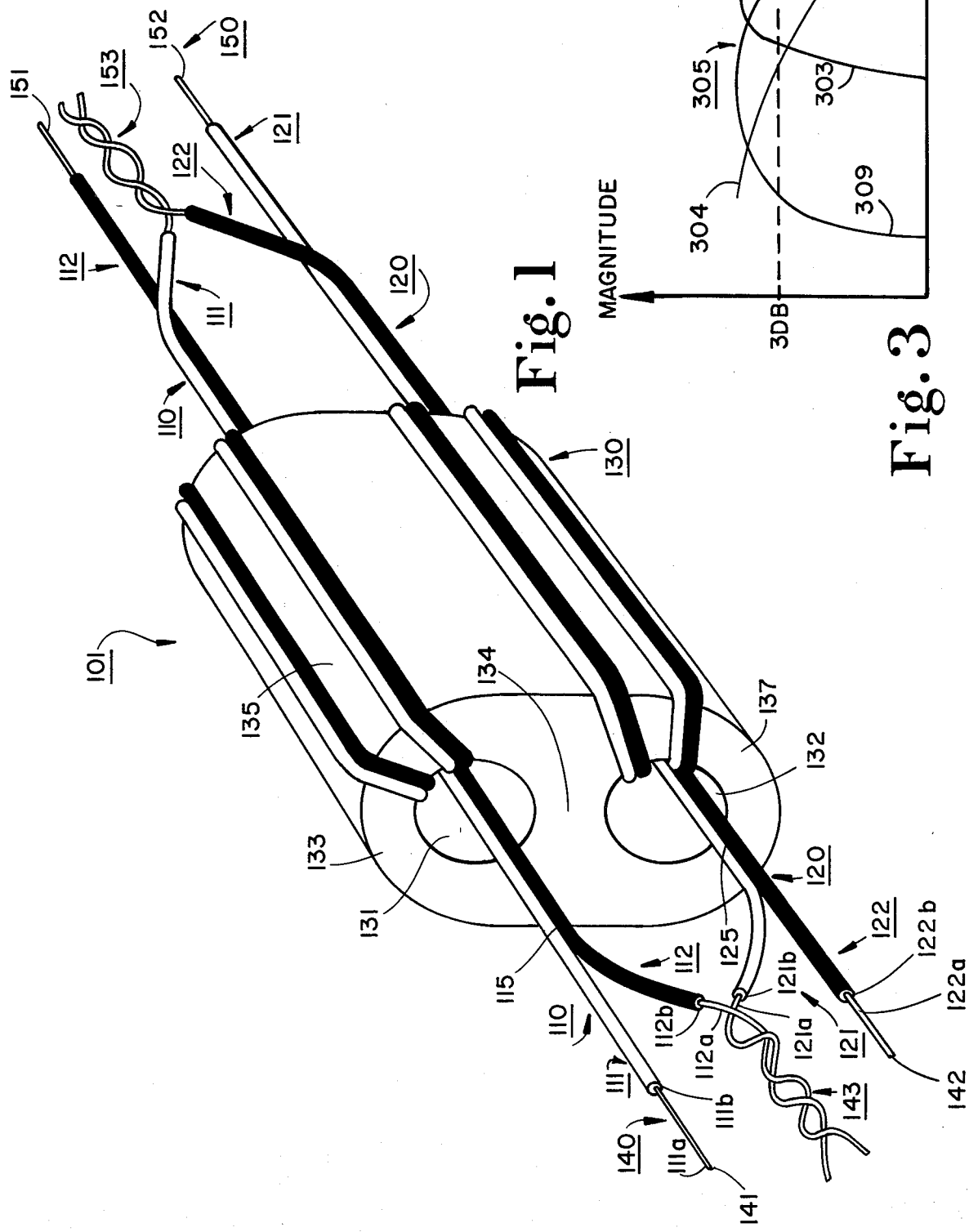
FIG. 1 of the drawing shows an isometric view of a preferred embodiment of the present antenna isolation device.

In FIG. 1, an antenna isolation device 101 constructed in accordance with the present invention includes a first bifilar transmission line 110, a second bifilar transmission line 120 and a magnetic core 130. Transmission line 110 is formed by wires 111 and 112 having conductors 111a and 112a, respectively, surrounded by dielectric coatings 111b and 112b, respectively. Dielectric coatings 111b and 112b are connected along a joint 115 by a thin insulating film (not shown) surrounding wires 111 and 112. Similarly, transmission line 120 is formed by wires 121 and 122, which conductors 121a and 122a, respectively, and dielectric coatings 121b and 122b, respectively. Dielectric coatings 121b and 122b are connected along a joint 125 by a thin insulating film (not shown) surrounding wires 121 and 122. Dielectric coatings 111b and 121b have a first color, e.g., white, and dielectric coatings 112b and 122b have a second color, e.g., black, to facilitate assembly of device 101.

Core 130 has a closed loop or toroidal configuration separated by a section 134 into an annular or toroidal portion 133 of core 130 between a tubular aperture 131 formed axially through core 130 and outer surface 135 of core 130 and an annular or toroidal portion 137 between aperture 132 formed through core 130 and outer surface 135. Transmission line 110 is wound with a predetermined number of turns, e.g., two and one half, through annular portion 133. Similarly, transmission line 120 is wound with the same number of turns and in the same sense as transmission line 110 around annular portion 137.

Device 101 has an input side or port 140 and an output side or port 150. On the input side 140 of device 101, conductor 112a of transmission line 110 and conductor 121a of transmission line 120 are twisted together and soldered (not shown) to form a junction 143, and bare ends of conductor 111a of transmission line 110 and conductor 122a of transmission line 120 form input leads 141 and 142, respectively. On output side 150 of device 101, conductor 111a of transmission line 110 and conductor 122a of transmission line 120 are twisted together and soldered to form a junction 153, and bare ends of conductor 112a of transmission line 110 and conductor 121a of transmission line 120 from output leads 151 and 152, respectively. As a result of these connections, a first current path is formed between input leads 141 and 142 and a second current path, electrically isolated from the first current path, is formed between output leads 151 and 152.

Figure 2:
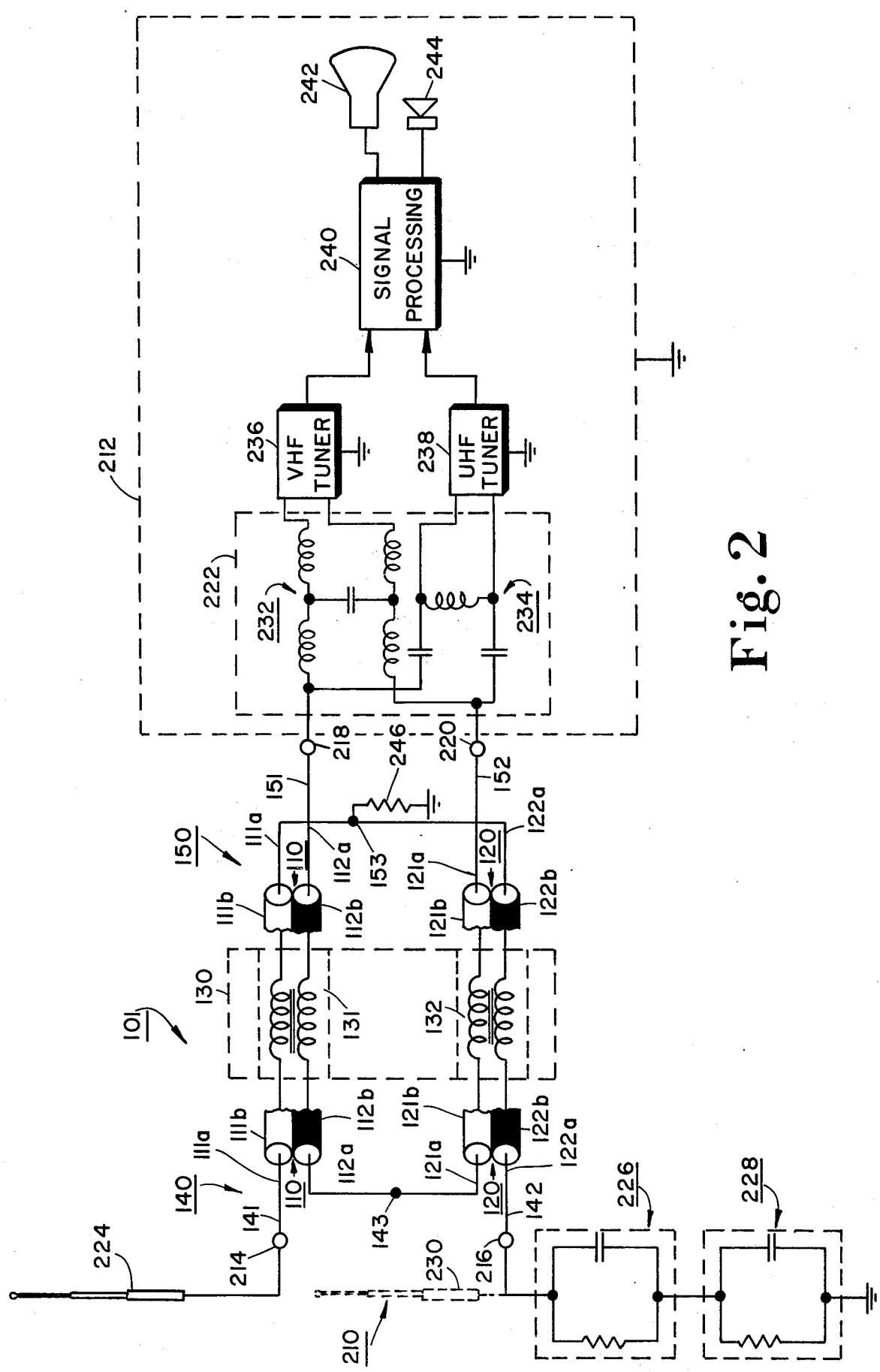
FIG. 2 of the drawing shows a schematic of a television receiver employing the antenna isolation device shown in FIG. 1.

In the arrangement of FIG. 2, isolation device 101 is coupled between an antenna network 210 and a chassis 212 of a television receiver. Input leads 141 and 142 of device 101 are connected to antenna input terminals 214 and 216, respectively. Output leads 151 and 152 of device 101 are connected to input terminals 218 and 220, respectively, of a signal splitter 222. Antenna network 210 includes a monopole antenna 224 coupled to antenna input terminal 214 and two series connected "capristors" 226 and 228, each including a parallel combination of a resistor and a capacitor, coupled between antenna input terminal 216 and signal ground. The capacitors in capristors 226 and 228 have capacitance values, e.g., 260 to 470 microfarads, selected so that for RF signals in both the VHF and UHF ranges, antenna input terminal 216 is effectively coupled to signal ground. Under these conditions, the metal housing (not shown) of the receiver, which is also coupled to signal ground, has the receiving characteristics of another monopole antenna 230, shown in phantom, which together with monopole antenna 224 forms a dipole antenna arrangement. Although a conventional monopole antenna may be utilized in place of the arrangement of capristors 226 and 228, since capristors are considerably less expensive than is a monopole antenna, the illustrated arrangement is desirable. Moreover, capristors 226 and 228 are included in a path for discharging excessively high static energies which may be developed at monopole 224 as will later be explained.

The RF signals received by antenna network 210 are coupled by device 101, in the manner to be described in detail below, to signal splitter 222. Signal splitter 222 includes a fixed tuned low pass filter 232 and a fixed tuned high pass filter 234 which separate the RF signals into VHF signals and UHF signals, respectively. Signal splitter 222 may be of the type employed in the KCS-202 television chassis manufactured by RCA Corporation and disclosed in "RCA Television Service Data, File 1977 B-3" for the KCS-202 chassis as shown in FIG. 2. The VHF signals are coupled to a VHF tuner 236 and the UHF signals are coupled to a UHF tuner 238. The IF output signals of tuners 236 and 238 are coupled to a signal processing portion 240 of chassis 212 where they are processed to derive video and audio signals. A picture tube 242 produces an image in response to the video signals and a speaker 244 produces an audio response in response to the audio signals.

In operation, the RF signals received by antenna network 210 undergo a voltage division at input port 140 of device 101 between lead 141 and node 143 and node 143 and lead 142 in proportion to the chacteristic impedances of transmission lines 110 and 120, which are effectively coupled in series between antenna input terminals 214 and 216. For example, assuming that the characteristic impedance of transmission lines 110 and 120 are equal, the RF signals developed between lead 141 and node 143 and node 143 and lead 142 will have amplitudes equal to one half the amplitudes of the RF signals developed between antenna input terminals 214 and 216. The RF signals developed between lead 141 and node 143 are coupled by transmission line 110 to output port 150 to develop an RF signal between lead 151 and node 153. Similarly, the RF signals developed between node 143 and lead 142 are coupled by transmission line 120 to output port 150 to develop RF signals between node 153 and lead 152. The RF signals developed between splitter input terminals 218 and 220 are the sum of the RF signals developed between lead 151 and node 153 and node 153 and lead 152. Since the RF signals between lead 151 and node 153 and node 153 and lead 152 are phase reversed with respect to the RF signals developed between lead 141 and node 143 and node 143 and lead 142, respectively, the RF signals developed at input splitter terminals 218 and 220 are phase reversed with respect to the RF signal developed between antenna input terminals 214 and 216, respectively.

To maximize the power transferred between antenna network 210 and splitter 222, it is desirable that the input impedance of device 101 be matched to the impedance of antenna network 210 between antenna input terminals 214 and 216 and that the output impedance of device 101 be matched to the input impedance of splitter 222 between splitter input terminals 218 and 220. Assuming that the impedances of antenna network 210 and the input impedance of splitter 222 are each 300 ohms, power transfer is optimized by selecting the characteristic impedances of transmission lines 110 and 120 (when wound on core 130) each to be 150 ohms. This is so because the input impedance of device 101, between leads 141 and 142, is equal to the sum of the impedance between lead 141 and node 143, i.e., the characteristic impedance of transmission line 110, and the impedance between node 143 and lead 142, i.e., the characteristic impedance of transmission line 120, and the output impedance of device 101, between leads 151 and 152, is equal to the sum of the impedance between lead 151 and node 153, i.e., the characteristic impedance of transmission line 110, and the impedance between node 153 and lead 152, i.e., the characteristic impedance of transmission line 120. While other characteristic impedances of transmission lines 110 and 120 having a sum equal to 300 ohms may be chosen, it is desirable to select the characteristic impedances of transmission lines 110 and 120, as well as other characteristics of transmission lines 110 and 120, as nearly equal as possible to optimize noise rejection, as will be more fully explained below.

While RF signals in both the VHF and UHF bands are coupled from antenna network 210 to splitter 222, it is noted that there is no direct connection between input port 140 of device 101 and output port 150 of device 101. The absence of a direct connection between input port 140 and output port 150 isolates chassis 212 from antenna network 210 and reduces the possibly harmful effects to a viewer when he comes in contact with monopole 224, antenna leads 214 and 216 or any other leads connected to these points due to chassis leakage currents which may be generated because chassis 212 is connected to signal ground. Isolation device 101 also reduces the possibility of harmful effects to a viewer or components of chassis 212 if lightning should strike antenna network 210. However, two transmission lines electrically connected as are transmission lines 110 and 120, but without a direct electrical connection between input port 140 and output port 150 or the additional elements of device 101, may not provide a suitable amplitude versus frequency response required to couple both VHF and UHF signals to splitter 222.

Conventionally, the amplitude versus frequency response characteristics of a transmission line are determined by its length. In FIG. 3, response 301 graphically represents the amplitude versus frequency response of an arrangement of two transmission lines electrically connected as are transmission lines 110 and 120 of device 101, but without its additional features. Response 301 is relatively narrowband. The center frequency of response 301 is inversely related to the length of the two transmission lines. Response 303 graphically represents the effects of winding the two transmission lines about a nonmagnetic core such as an air core. Response 303 has a somewhat larger bandwidth than does response 301 because the windings of the transmission lines increases the inductance in the conductors of the transmission lines and therefore the magnetic coupling between the conductors. Unfortunately, the windings increase the effective length of the transmission lines and thereby decrease the center frequency of the response.

In device 101, transmission lines 110 and 120 are wound about annular or toroidal portions 133 and 137, respectively, of core 130 formed of a material having a permeability characteristic, such as 304 of FIG. 3, which is an inverse function of frequency so that its magnetic effects are manifested to a much larger degree at low frequencies than at high frequencies. As a result of core 130, signals flowing in the current path between input leads 141 and 142 are magnetically coupled to the current path between output leads 151 and 152 more effectively at low frequencies than at high frequencies. This tends to extend the response of device 101 into the range of relatively low frequencies.

Response 305 of FIG. 3 graphically illustrates the amplitude versus frequency response of device 101. Although core 130 somewhat affects the upper frequency portion of response 305, i.e., lowers its upper frequency roll-off portion 307, due to the extra inductance provided to transmission lines 110 and 120 by core 130, the upper frequency portion of response 305 is primarily a function of the lengths of transmission lines 110 and 120 and the number of winding turns about annular portions 133 and 137 of core 130. It is noted that the lengths of transmission lines 110 and 120 and the number of winding turns about annular portions 133 and 137, respectively, are interrelated in the sense that the axial length of apertures 131 and 132 and the selected lengths of transmission lines 110 and 120 determine the required number of turns about annular portions 133 and 137, respectively. The length of transmission lines 110 and 120 wound about annular portions 133 and 137, respectively, of core 130 are selected so that the 3 db point of upper frequency roll-off portion 307 of response 305 is slightly above the highest UHF frequency, e.g., 870 MHz in the United States. Lower frequency portion 309 of response 305 is primarily a function of the permeability and the form factor, i.e., shape, of core 130 and is selected so that the lower frequency 3 db point of lower roll-off portion 309 of response 305 is slightly below the lowest VHF frequency, e.g., 57 MHz in the United States. To minimize the effects of core 130 on upper frequency response 307, it is desirable to select the permeability of core 130 to be insignificant at 870 MHz.

Core 130 and the number of turns of transmission lines 110 and 120 about annular portions 133 and 137, respectively, not only affect the amplitude versus frequency response characteristic of device 101, but also affect its input and output impedances. Normally, the characteristic impedance of a bifilar transmission line is a function of the conductor size, i.e., gauge, the spacing between the conductors and the dielectric material between the conductors. Specifically, the characteristic impedances of transmission lines such as transmission lines 110 and 120 before being wound on core 130 are inversely related to the diameters of conductors 111a, 112a, 121a and 122a and directly related to the diameters and dielectric coefficients of dielectric coatings 111b, 112b, 121b and 122b. Winding a transmisson line around a core such as core 130 tends to reduce its characteristic impedance. Therefore, transmission lines 110 and 120 are selected to have characteristic impedances somewhat higher, e.g., 175 ohms, before they are wound on core 130 than the characteristic impedances, e.g., 150 ohms, they are desired to have after they are wound on core 130.

It is noted that while there are some parasitic capacitances between windings of transmission lines 110 and 120, the parasitic capacitances are, in essence, components of the characteristic impedances of transmission lines 110 and 120 and as such do not seriously limit the bandwidth of device 101. In a conventional transformer, which may be utilized to isolate antenna network 210 from chassis 212, interwinding capacitances tend to resonate with leakage inductances and thereby limit the high frequency response of the transformer. In this respect, to minimize response limiting effects of parasitic capacitance between transmission lines 110 and 120, it is desirable also to separate transmission lines 110 and 120 as much as possible on core 130. Separate apertures 131 and 132 are useful to this end and also facilitate the assembly of the winding of transmission lines 110 and 120 about core 130. However, it should be noted that a single aperture through core 130 may also be utilized.

Dielectric materials 111b, 112b, 121b and 122b forming the insulation of wires 111, 112, 121 and 122, respectively, in addition to being selected in relation to the characteristic impedances of transmission lines 110 and 120, are selected to withstand the application of relatively high voltages, e.g., in the order of 10,000 volts, between conductors 111a and 112a and 121a and 122a, respectively, before breaking down so as to provide the desired DC isolation between input port 140 and output port 150, discussed above, or when a viewer contacts the monopole 224 or antenna terminals 214 and 216 or other leads which may be connected to these points, or when lightning strikes antenna network 210. In addition, for this purpose the material of core 130 is selected to have a relatively high resistance characteristic, e.g., $2 \times 10^7$ ohm centimeters.

As was earlier noted, capristors 226 and 228 are connected in series between antenna input terminal 216 and signal ground so that the metal structure of chassis 212 serves as a monopole antenna. Although capacitors could be utilized for this purpose, it is desirable to utilize capristors as shown in FIG. 2 because the resistors of capristors 226 and 228, respectively, form a DC path between input terminal 216 and signal ground which in conjunction with the DC path formed by the series connection of conductors 111a of transmission line 110 and 122a of transmission line 120 between antenna terminals 214 and 216 comprise a DC path for harmlessly discharging relatively high static energies which may develop at monopole 224 to signal ground. For this purpose, the resistors of capristors 226 and 228 are selected to each have relatively large values, e.g., 1.5 megohms. It is noted that it is desirable to utilize two capristors in series rather than one to provide electrical isolation even in the event when one of the two capristors should short. To accomplish the same result when antenna network 210 is disconnected from antenna terminals 214 and 216 and a conventional outside or house antenna network (not shown) is connected to antenna terminals 214 and 216, a relatively high value, e.g., 3.3 megohms, resistor 244 is connected between node 153 and signal ground.

In addition to the DC isolation and response characteristics of device 101 set forth above, device 101 tends to reduce the amplitude of noise signals coupled from antenna network 210 to chassis 212. As earlier stated, the effect of winding transmission lines around annular portions 133 and 137 of core 130 is to introduce additional inductance to conductors 111a, 112a, 121a and 122a. Since desired RF signals provided by antenna network 210 are coupled in a balanced manner through each of transmission lines 110 and 120, i.e., the current flowing through conductors 111a and 112a and the current flowing through conductors 121a and 122a, respectively, are of substantially equal magnitude but opposite in polarity, the field external to transmission lines 110 and 120 due to desired RF signals is relatively small. Therefore, desired RF signals are substantially unaffected by the inductance introduced in conductors 111a, 112a, 121a and 122a by the magnetic material in annular portions 133 and 137 of core 130. However, because many undesired noise signals tend to be unbalanced, the electric field external to transmission lines 110 and 120 due to such noise signals external is relatively large. Therefore, unbalanced noise signals flowing through conductors 111a, 112a, 121a and 122a are relatively attenuated by the inductance introduced in conductors 111a, 112a, 121a and 122a by the magnetic material in annular portions 133 and 137 of core 130.

Although the arrangement of antenna network 210 including capristors 226 and 228 is intended to be a balanced configuration, because antenna terminal 216 is coupled to signal ground through capristors 226 and 228, some unbalance is introduced in antenna network 210. Device 101 has been found effective in somewhat compensating for the slight signal imbalance presented by antenna network 210 by isolating chassis 212 from unbalanced signals as described above. As a result, it has been found that the position of monopole 224 is less critical and is less affected by the nearness of a viewer when it is adjusted. Furthermore, it has been observed that picture ghosts are somewhat reduced.

The following parameters of varous elements of device 101 have been found to provide suitable performance:

| | |
|---|---|
| Gauge of wires 111a, 112a, 121a and 122a | #30 |
| Diameter or dielectric coatings 111b, 112b, 121b, 122b | 0.013 inch |
| Dielectric material of coatings 111b, 112b, 121b, 122b | polyvinyl chloride |
| Dielectric coefficient of coatings 111b, 112b 121b, 122b | approximately 2.85 |
| Characteristic impedance of transmission lines 110 and 120 prior to winding | 175Ω ± 5% |
| Material of core 130 | Ceramag 11 from Stackpole Carbon Co. |
| Permeability of core 130 at 55 MHz | approximately 70 |
| Permeability of core 130 at 890 MHz | approximately 0 |
| Diameter of apertures 131 and 132 | 0.150 ± .010 inch |
| Width of annular portions 133 and 137 | 0.060 to 0.085 inch thick |
| Width across end of core | 0.525 ± .025 inch |
| Length of core 130 | 0.545 ± .015 inch |
| Number of turns per transmission line | 2.5 |

Bifilar wire with the above parameters may be obtained from Brand-Rex Co. as vendor part number TC-1052. A core with the above parameters may be obtained from Stackpole Carbon Co. as vendor part number 57-9013.

What is claimed is

1. In a television receiver, apparatus for processing RF signals in both a VHF range and a UHF range received by an antenna network, comprising:
   first and second antenna terminals;
   signal splitter means for separating RF signals in the VHF range from RF signals in the UHF range, said signal splitter means including first and second input terminals;
   a core having a closed loop configuration; and
   first and second transmission lines each having first and second conductors, each of said conductors having first and second ends, each of said transmission lines being wound about said closed loop configuration of said core in the same sense and with a predetermined number of turns, said first end of said first conductor of said first transmission line being coupled to said first antenna terminal, said first end of said second conductor of said second transmission line being coupled to said second antenna terminal, said first end of said second conductor of said first transmission line being coupled to said first end of said first conductor of said second transmission line, said second end of said second conductor of said first transmission line being coupled to said first splitter input terminal, said second end of said first conductor of said second transmission line being coupled to said second splitter input terminal, said second end of said first conductor of said first transmission line being coupled to said second end of said second conductor of said second transmission line;
   said predetermined number of turns being selected to substantially determine an upper frequency 3 db point higher than the highest frequency in said UHF range;
   said core being formed from a magnetic material having permeability characteristics which are an inverse function of frequency and selected to substantially determine a lower frequency 3 db point below the lowest frequency in said VHF range without substantially affecting said upper frequency 3 db point.

2. The apparatus recited in claim 1 wherein said first and second transmission lines are bifilar transmission lines.

3. The apparatus recited in claim 2 wherein said first and second transmission lines alone have characteristic impedances slightly higher than one half the impedance of said antenna network.

4. The apparatus recited in claim 3 wherein said closed loop configuration is partitioned into first and second annular portions by a section of said core; said first transmission line is wound about said first annular portion; and said second transmission line is wound about said second annular portion.

5. The apparatus recited in claim 1 wherein said first end of said first conductor of said first transmission line is directly connected to said first antenna terminal; said first end of said second conductor of said second transmission line is directly connected to said second antenna terminal; said first end of said second conductor of said first transmission line and said first end of said first conductor of said second transmission line are directly connected; said second end of said first transmission line is directly connected to said first splitter input terminal; said second end of said first conductor of said second transmission line is directly connected to said second splitter input terminal; and said second end of said first conductor of said first transmission line is directly connected to said second end of said second conductor of said second transmission line.

6. The apparatus recited in claim 5 wherein one of said first conductor of said first transmission line and said second conductor of said second transmission line is resistively coupled to a point of reference potential.

7. The apparatus recited in claim 6 wherein at least one of said first and second antenna terminals is coupled to a monopole antenna and the other of said antenna terminals is coupled through at least two capristors to said point of reference potential.

8. The apparatus recited in claim 1 wherein said signal splitter means includes a fixed tuned low pass filter and a fixed tuned high pass filter.

9. Apparatus for coupling RF signals in a television frequency range received by an antenna network to an RF signal processing circuit of a receiver, comprising:
a core having a closed loop configuration; and
first and second bifilar transmission lines each having first and second conductors, each of said conductors having first and second ends, each of said transmission lines being wound about said closed loop configuration of said core in the same sense and with a predetermined number of turns, said first end of said first conductor of said first transmission line being a first input lead, said first end of said second conductor of said second transmission line being a second input lead, said first end of said second conductor of said first transmission line being directly connected to said first end of said first conductor of said second transmission line, said second end of said second conductor of said first transmission line being a first output lead, said second end of said first conductor of said second transmission line being a second output lead, said second end of said first conductor of said first transmission line being directly connected to said second end of said second conductor of said second transmission line;

said core being formed from a magnetic material having permeability which is an inverse function of frequency and selected to substantially determine a lower frequency 3 db point below the lowest frequency in said range;

said predetermined number of turns being selected to substantially determine an upper frequency 3 db point higher than the highest frequency in said range;

said first and second transmission lines alone having characteristic impedances slightly higher than one half the impedance of said antenna network.

* * * * *